US009605629B2

(12) United States Patent
Morey

(10) Patent No.: US 9,605,629 B2
(45) Date of Patent: Mar. 28, 2017

(54) UNDER-HOOD MOUNTING CONFIGURATION FOR A CONTROL UNIT OF A WORK VEHICLE

(71) Applicant: CNH Industrial America, LLC, New Holland, PA (US)

(72) Inventor: Daniel Morey, Mundelein, IL (US)

(73) Assignee: CNH Industrial America LLC, New Holland, PA (US)

( * ) Notice: Subject to any disclaimer, the term of this patent is extended or adjusted under 35 U.S.C. 154(b) by 0 days.

(21) Appl. No.: 14/507,973

(22) Filed: Oct. 7, 2014

(65) Prior Publication Data

US 2015/0233329 A1  Aug. 20, 2015

Related U.S. Application Data

(60) Provisional application No. 61/939,899, filed on Feb. 14, 2014.

(51) Int. Cl.
*F01P 1/06* (2006.01)
*F02M 35/10* (2006.01)
*F01N 3/08* (2006.01)

(52) U.S. Cl.
CPC ..... *F02M 35/10242* (2013.01); *F01N 3/0814* (2013.01); *F02M 35/10091* (2013.01)

(58) Field of Classification Search
CPC ........ F02M 35/10242; F02M 35/10091; F01N 3/0814

(Continued)

(56) References Cited

U.S. PATENT DOCUMENTS 4,375,797 A  3/1983 Otsuka et al.
5,937,821 A  8/1999 Oda et al.
(Continued)

FOREIGN PATENT DOCUMENTS

EP  0084099  7/1983
EP  1340896  9/2003
(Continued)

OTHER PUBLICATIONS

GreenLink Systems—Engine Monitoring Unit Emissions Monitoring Unot (NEMU) Dated Mar. 2013 (2 Pages).
(Continued)

*Primary Examiner* — Marguerite McMahon
(74) *Attorney, Agent, or Firm* — Rickard K. DeMille; Rebecca L. Henkel

(57) ABSTRACT

An under-hood mounting configuration for a work vehicle may generally include an air intake component positioned upstream of an engine of the work vehicle. The air intake component may include a wall having an exterior surface and an interior surface. The wall may define a cooling port extending between the exterior surface and the interior surface. In addition, the under-hood mounting configuration may include a control unit having a housing defining an upper surface and a lower surface opposite the upper surface. The housing may be mounted to the wall along the exterior surface such that the housing is positioned directly over at least a portion of the cooling port. When the airflow is directed through the air intake component, a portion of the airflow may flow through the cooling port and may be directed towards the lower surface of the housing.

18 Claims, 6 Drawing Sheets

(58) Field of Classification Search
USPC .................................. 123/184.21, 184.53
See application file for complete search history.

(56) References Cited

U.S. PATENT DOCUMENTS

| | | | |
|---|---|---|---|
| 5,988,119 A * | 11/1999 | Trublowski et al. | 123/41.31 |
| RE36,451 E * | 12/1999 | Gillespie et al. | 123/403 |
| 6,032,634 A * | 3/2000 | Minegishi et al. | 123/184.55 |
| 6,082,176 A | 7/2000 | Kondo et al. | |
| 6,309,536 B1 | 10/2001 | Inagaki et al. | |
| 6,470,252 B2 | 10/2002 | Tashiro et al. | |
| 6,494,186 B1 | 12/2002 | Wakeman | |
| 6,796,291 B2 | 9/2004 | Suzuki et al. | |
| 6,886,396 B2 | 5/2005 | Tsukamoto et al. | |
| 6,925,980 B2 * | 8/2005 | Glovatsky | 123/184.21 |
| 7,363,900 B2 * | 4/2008 | Griessbach et al. | 123/184.21 |
| 7,596,991 B2 | 10/2009 | Redon | |
| 7,597,091 B2 | 10/2009 | Suziki et al. | |
| 8,219,278 B2 * | 7/2012 | Sawada et al. | 701/30.3 |
| 8,336,656 B2 | 12/2012 | Shiratori et al. | |
| 8,469,010 B2 | 6/2013 | Inoue | |
| 9,222,448 B2 * | 12/2015 | Ghorpade et al. | |
| 2002/0026822 A1 | 3/2002 | Reading et al. | |
| 2002/0104490 A1 | 8/2002 | Itakura et al. | |
| 2003/0084859 A1 * | 5/2003 | Glovatsky et al. | 123/41.31 |
| 2004/0089060 A1 | 5/2004 | Suzuki | |
| 2007/0084444 A1 | 4/2007 | Bellistri et al. | |
| 2009/0100907 A1 | 4/2009 | Mizutani et al. | |
| 2011/0184631 A1 | 7/2011 | Winsor et al. | |
| 2012/0036843 A1 * | 2/2012 | Schertz et al. | 60/301 |
| 2013/0145830 A1 | 6/2013 | Kim | |

FOREIGN PATENT DOCUMENTS

| | | |
|---|---|---|
| FR | 2670277 | 6/1992 |
| JP | S58185924 | 10/1983 |
| WO | 0210587 | 2/2002 |

OTHER PUBLICATIONS

European Search Report issued Jun. 22, 2015 for European Application No. 15154855.9 (8 pages).

* cited by examiner

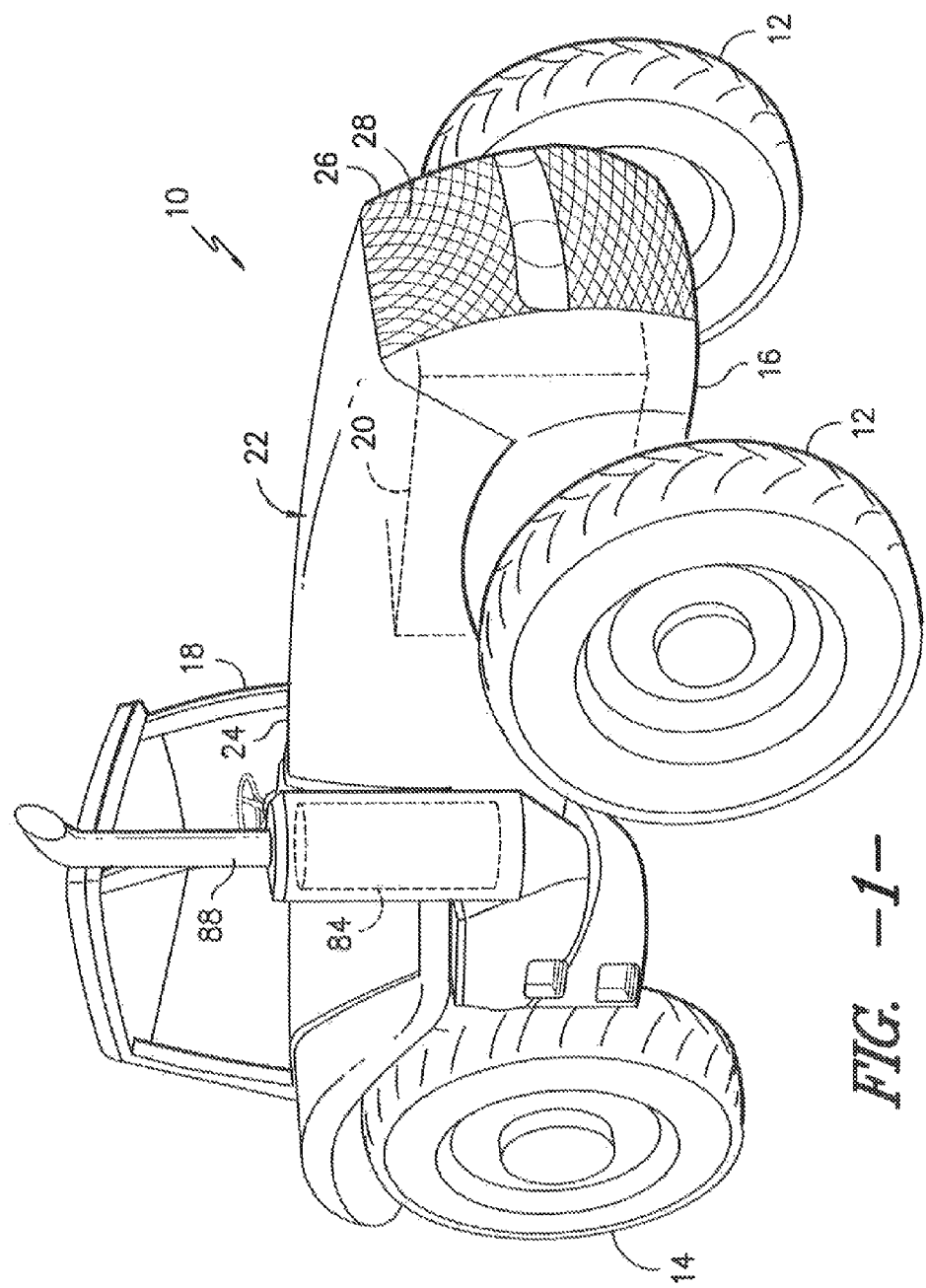
FIG. -1-

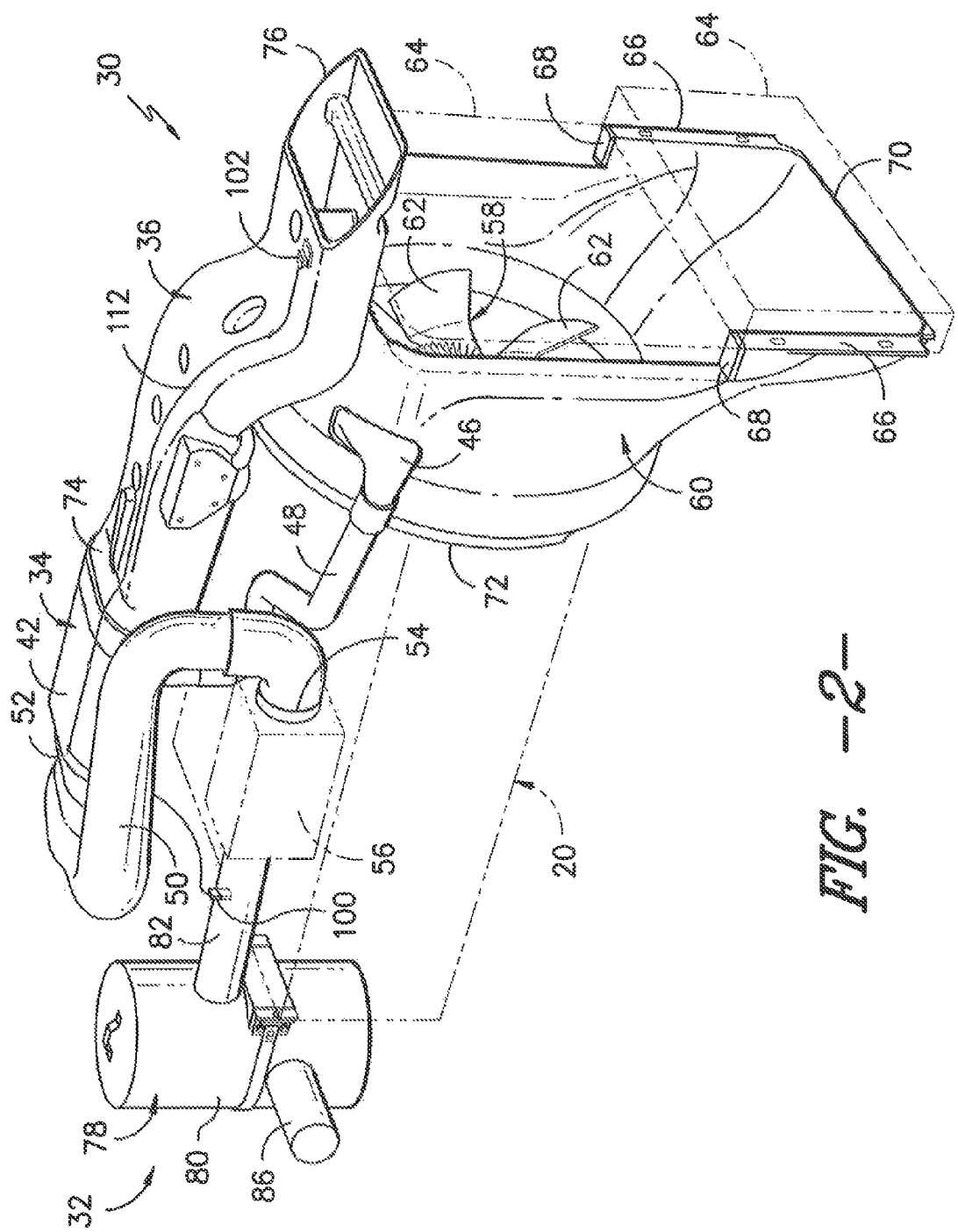
FIG. -2-

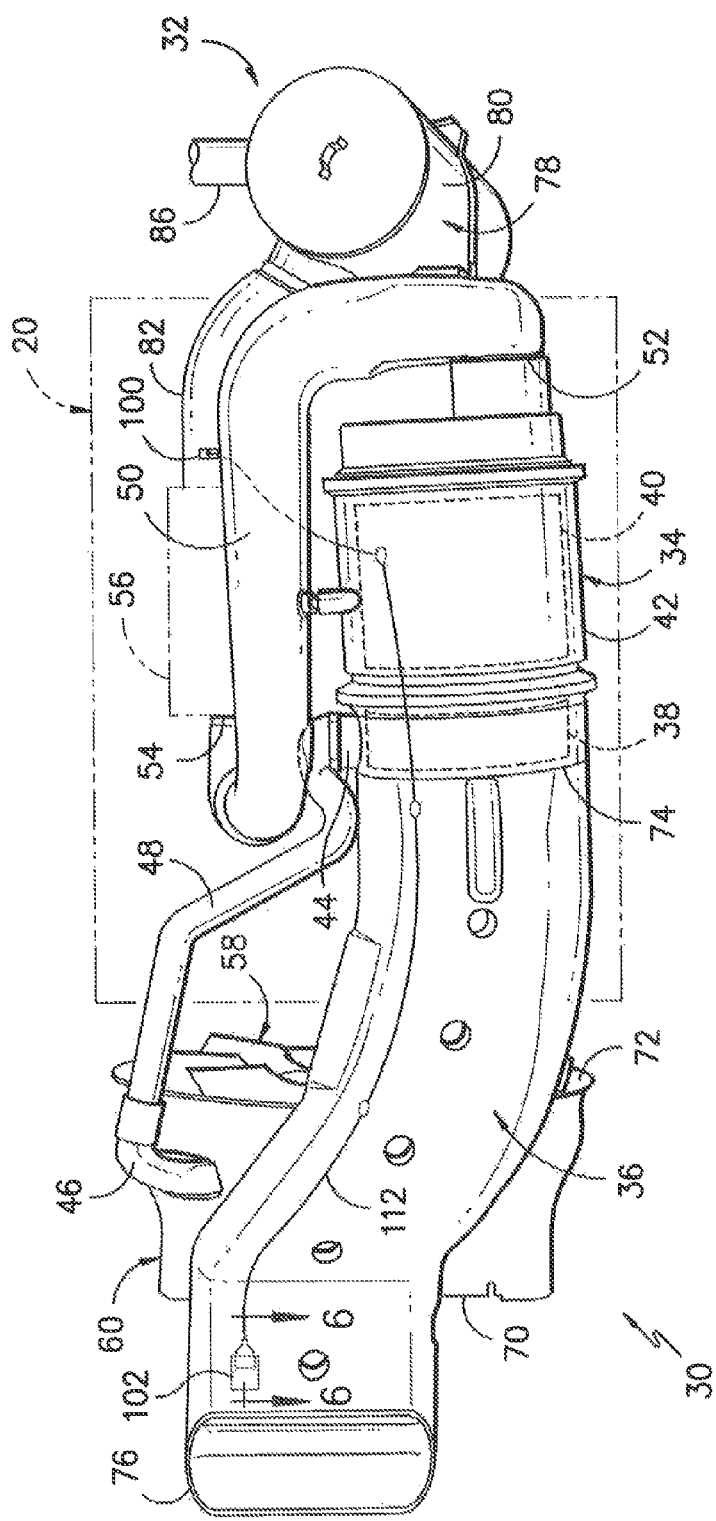
FIG. -3-

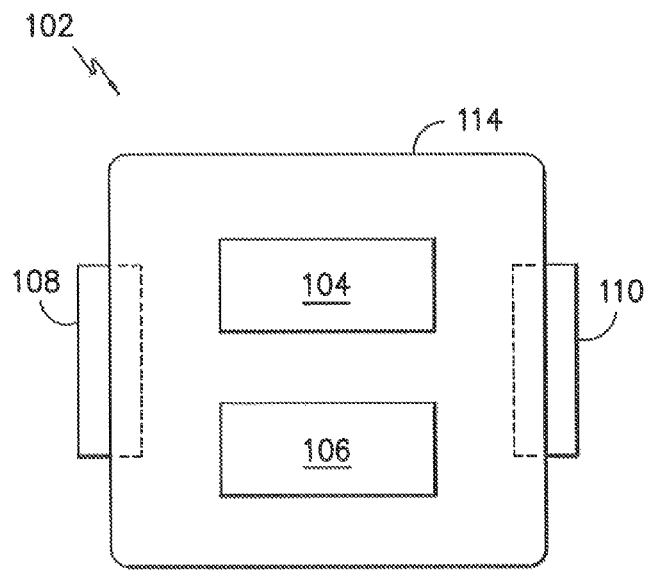
FIG. -4-
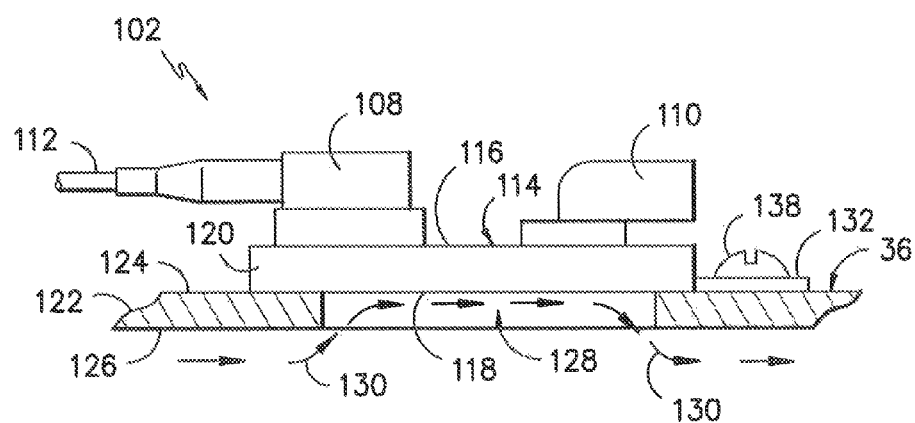
FIG. -6-

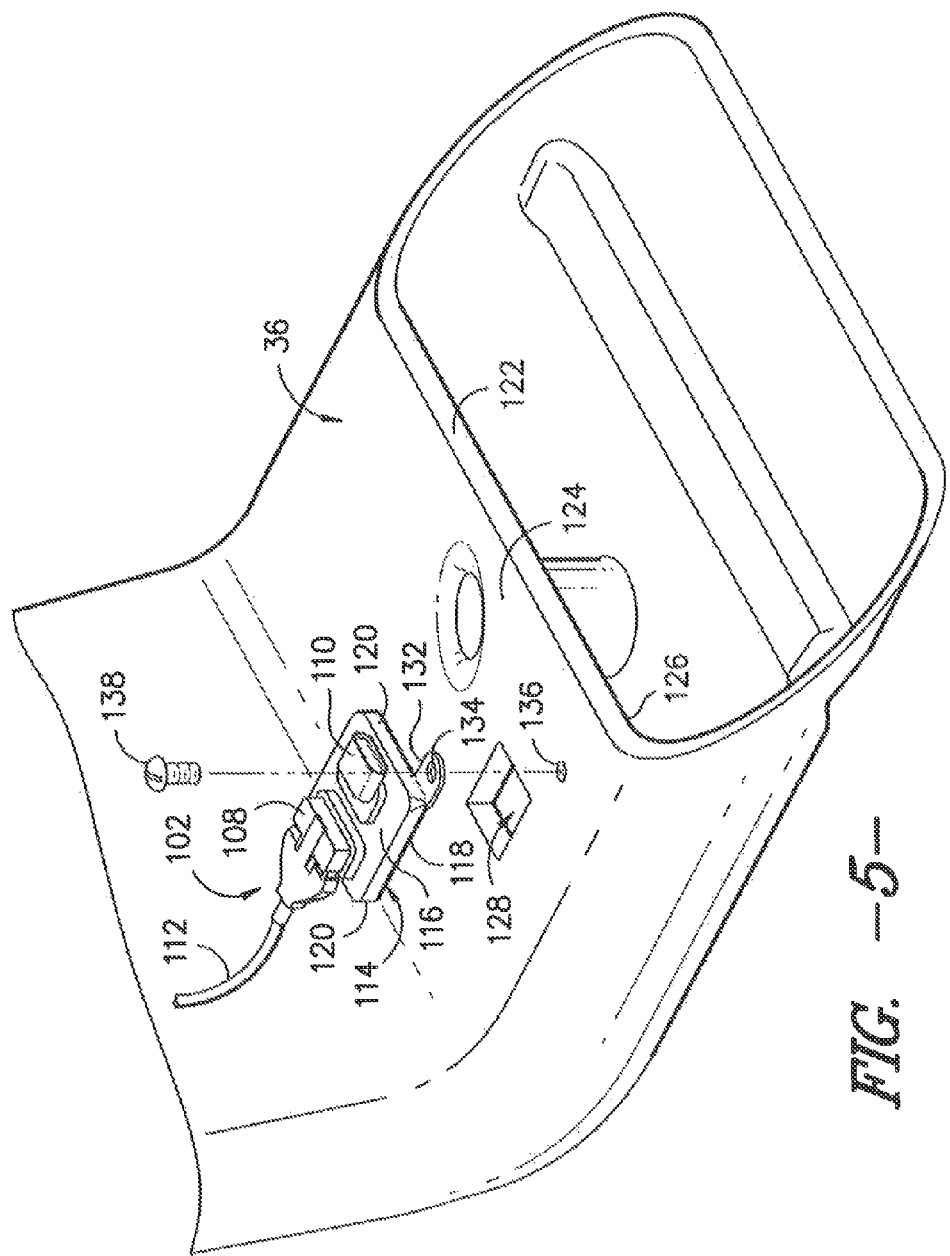
FIG. -5-

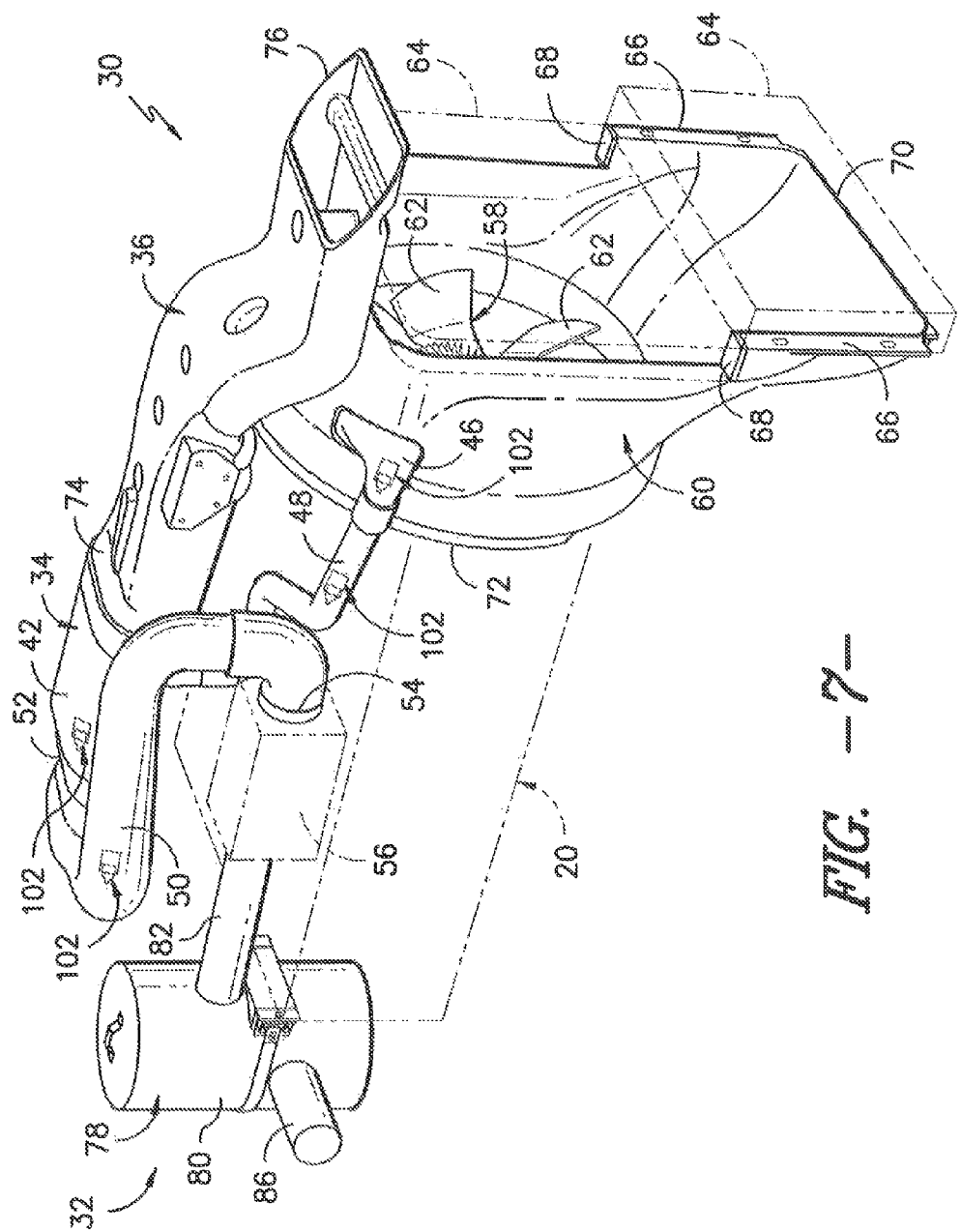
FIG. -7-

UNDER-HOOD MOUNTING CONFIGURATION FOR A CONTROL UNIT OF A WORK VEHICLE

FIELD OF THE INVENTION

The present subject matter relates generally to work vehicles and, more particularly, to an under-hood mounting configuration for a control unit of a work vehicle.

BACKGROUND OF THE INVENTION

Work vehicles, such as tractors and other agricultural vehicles, typically include one or more electronic control units (ECUs) configured to receive input signals and/or transmit output signals for monitoring and/or controlling vehicle operation. For example, work vehicles often include an emission sensor control unit communicatively coupled to one or more emission sensors, such as a nitrous oxide (NOx) sensor, configured to measure the concentration of one or more emission gases contained within the exhaust flow expelled from the vehicle's engine. As such, the emission sensor control unit may be configured to receive emission-related measurement signals from the sensor(s). Suitable control signals may then be transmitted from the emission sensor control unit to an engine control unit of the work vehicle to allow the operation of the engine to be controlled based on the emission-related measurements provided by the sensor(s).

In general, it is often desirable to position the control unit(s) of a work vehicle under the vehicle's hood to allow such control unit(s) to be in close in proximity to the components with which the unit(s) must communicate. However, electronic control units are typically required to be maintained below a specific operating temperature. Unfortunately, at high ambient temperatures and/or during high load applications, the under-hood air temperature of a work vehicle may often reach and/or exceed the predetermined temperature limit defined for a given control unit. As a result, there is an increased likelihood of damage occurring to such control unit due to overheating. In addition, after a hot shutdown, the under-hood air temperatures of a work vehicle often increases well above the under-hood temperatures typically experienced during vehicle operation, thereby further increasing the likelihood of damage occurring to any control units installed under the hood.

Moreover, conventional under-hood mounting arrangements typically require that a control unit be mounted to a separate mounting bracket installed under the hood. Such mounting brackets unnecessarily increase the number of under-hood components required for a work vehicle. In addition, since control units typically need to be isolated from vehicle vibrations to operate properly, vibration isolators must often be associated with the mounting bracket(s) to satisfy the vibration requirements of such control units, thereby increasing the overall costs of the installation.

Accordingly, an improved under-hood mounting configuration for a control unit of a work vehicle that addresses one or more of the issues highlighted above would be welcomed in the technology.

BRIEF DESCRIPTION OF THE INVENTION

Aspects and advantages of the invention will be set forth in part in the following description, or may be obvious from the description, or may be learned through practice of the invention.

In one aspect, the present subject matter is directed to an under-hood mounting configuration for a work vehicle having an engine and an air intake system for supplying air to the engine. The under-hood mounting configuration may include an air intake component positioned upstream of the engine relative to an airflow directed through the air intake system. The air intake component may include a wall baying an exterior surface and an interior surface. The wall may define a cooling port extending between the exterior surface and the interior surface. In addition, the under-hood mounting configuration may include a control unit having a housing defining an upper surface and a lower surface opposite the upper surface. The housing may be mounted to the wall along the exterior surface such that the housing is positioned directly over at least a portion of the cooling port. When the airflow is directed through the air intake component, a portion of the airflow may flow through the cooling port and may be directed towards the lower surface of the housing.

In another aspect, the present subject matter is directed to a system for monitoring exhaust emissions of a work vehicle having an engine and an air intake system for supplying air to the engine. The system may generally include an emission sensor in flow communication with an exhaust flow expelled from the engine. The emission sensor may be configured to provide emission-related measurements associated with at least one gas contained within the exhaust flow. The system may also include a sensor control unit configured to receive the emission-related measurements from the exhaust sensor. The sensor control unit may include a housing defining an upper surface and a lower surface opposite the upper surface. In addition, the system may include an air intake component positioned upstream of the engine relative to an airflow directed through the air intake system. The air intake component may include a wall having an exterior surface and an interior surface. The wall may define a cooling port extending between the exterior surface and the interior surface. The housing of the sensor control unit may be mounted to the wall along the exterior surface such that the housing is positioned directly over at least a portion of the cooling port and, when the airflow is directed through the air intake component, a portion of the airflow may flow through the cooling port and may be directed towards the lower surface of the housing.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a perspective view of one embodiment of a work vehicle;

FIG. 2 illustrates a front perspective view of various components of an air intake system and an exhaust treatment system suitable for use with the work vehicle shown in FIG. 1, particularly illustrating an emission sensor control unit of the work vehicle mounted to an intake conduit of the air intake system;

FIG. 3 illustrates a top view of the components shown in FIG. 2;

FIG. 4 illustrates a schematic view of one embodiment of suitable components that may be included within a control unit of the work vehicle;

FIG. 5 illustrates a close-up, partial perspective view of the intake conduit shown in FIGS. 2 and 3, particularly illustrating the emission sensor control unit exploded away from the intake conduit;

FIG. 6 illustrates a cross-sectional view of the emission sensor control unit mounted onto the intake conduit taken about line 6-6 shown in FIG. 3, particularly illustrating the control unit positioned over a cooling port defined through the intake conduit; and FIG. 7 illustrates a similar view of the various components of the air intake system and the exhaust treatment system shown in FIG. 2, particularly illustrating alternative mounting locations for mounting the emission sensor control unit under the hood of the work vehicle.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to an improved mounting configuration for a control unit of a work vehicle. Specifically, in several embodiments, the control unit may be configured to be mounted to an exterior surface of any suitable air intake component of the work vehicle positioned upstream of the vehicle's engine. For example, the control unit may be mounted to an exterior surface of an intake conduit, a filter assembly, an output conduit or aspiration component (e.g., an aspiration conduit or aspiration scoop) of the air intake system.

Additionally, in several embodiments, a cooling port may be defined through a wall of the air intake component so that air flowing through the interior of the component may be directed through the cooling port towards the component's exterior surface. In such embodiments, the control unit may be mounted to the air intake component directly over the cooling port such that a portion of the airflow through the component may be directed through the port and contact the lower surface of the control unit, thereby providing a means for cooling the control unit so as to prevent overheating. Specifically, the temperature of the intake air supplied through the air intake system is typically significantly cooler than the temperature of the air contained under the vehicle's hood. As a result, the convective cooling provided by the air flowing through the cooling port may allow for the control unit to have an operating temperature that is significantly less than the operating temperature that would otherwise be achieved by mounting the control unit at different under-hood location. In addition, given the reduced operating temperatures, the initial temperature of the control unit at the beginning of a hot shutdown may be less, thereby decreasing the likelihood that the control unit overheats as the under-hood air temperature increases over time.

In addition to providing convective cooling for the control unit, the disclosed mounting configuration may also allow for the control unit to be isolated from vibrations. Specifically, the air intake components are typically isolated from the vibrations occurring during vehicle operation. For example, the ducts contained within the air intake system are often made from plastic and, thus, provide for natural dampening of the engine vibrations and other vehicle vibrations. Thus, by mounting the control unit to such component(s), the control unit may be vibrationally isolated from vehicle vibrations. Moreover, since the disclosed mounting configuration utilizes existing vehicle components to mount the control unit under the hood as opposed to additional brackets and/or other mounting components, the total number of under-hood components for the work vehicle may be reduced, thereby decreasing overall costs and providing additional storage space under the hood.

In general, the present subject matter will be described herein with reference to an emission sensor control unit. However, it should be appreciated by those of ordinary skill in the art that the disclosed mounting configuration may generally be utilized for mounting any suitable control unit of the work vehicle under the vehicle's hood.

Referring now to the drawings, FIG. 1 illustrates a perspective view of one embodiment of a work vehicle 10. As shown, the work vehicle 10 is configured as an agricultural tractor. However, in other embodiments, the work vehicle 10 may be configured as any other suitable work vehicle known in the art, such as various other agricultural vehicles (e.g., combines), earth-moving vehicles, road vehicles, loaders and/or the like.

As shown in FIG. 1, the work vehicle 10 includes a pair of front wheels 12, a pair or rear wheels 14 and a chassis 16 coupled to and supported by the wheels 12, 14. An operator's cab 18 may be supported by a portion of the chassis 16 and may house various control devices (not shown) for permitting an operator to control the operation of the work vehicle 10. Additionally, the work vehicle 10 may include an engine 20 and a transmission (not shown) mounted on the chassis 16. The transmission may be operably coupled to the engine 20 and may provide variably adjusted gear ratios for transferring engine power to the wheels 14 via a differential (not shown).

The work vehicle 10 may also include a hood 22 configured to extend between an aft end 24 disposed adjacent to the cab 18 and a forward end 26 defining a grille 28 at the front of the work vehicle 10. As is generally understood, the hood 22 may be configured to least partially surround and/or cover various under-hood components of the wok vehicle 10, such as the engine 20 and any other suitable under-hood components (e.g., hydraulic components, pneumatic components, electrical components, mechanical component(s), storage tank(s), etc.). As will be described below, various components of an air intake system 30 and an exhaust cleaning system 32 of the work vehicle 10 may also be housed within, installed underneath and/or otherwise positioned vertically below the hood 22.

Referring now to FIGS. 2 and 3, differing views of at least a portion of an air intake system 30 and an exhaust cleaning system 32 suitable for use with the work vehicle 10 shown in FIG. 1 are illustrated in accordance with aspects of the present subject matter. Specifically, FIG. 2 illustrates a perspective view of various components of the air intake and exhaust cleaning systems 30, 32. Additionally, FIG. 3 illustrates a top view of the components shown in FIG. 2.

As shown, the air intake system 30 may generally include a filter assembly 34 configured to receive dirty air from an intake duct 36 and clean/filter such air for subsequent delivery to the engine 20 (shown in phantom lines). In general, the filter assembly 34 may include a pre-cleaner (indicated by dashed box 38 in FIG. 3) and an air filter (indicated by dashed box 40 in FIG. 3) disposed downstream of the pre-cleaner 38. In addition, the filter assembly may include a housing 42 configured to house or otherwise encase the pre-cleaner 38 and the air filter 40.

As is generally understood, the pre-cleaner 38 may be configured to remove portions of the dust, dirt, debris, plant matter and other particulates contained within the air flowing into the filter assembly 34 via the intake duct 36. Specifically, in several embodiments, the pre-cleaner 38 may include one or more tubes (e.g., turbo tubes), dirt separators, and/or any other suitable pre-cleaner elements (not shown) configured to separate large particulates from the air via centripetal force. For example, the pre-cleaner element(s) may be configured to impart a vortex or spinning motion to the flow of air entering the filter assembly 34. As a result, the large particulates contained within the air may be forced radially outwardly along the inner wall of the housing 42 by the centripetal force of the vortex/spinning motion. Such particulates may then be expelled from the filter assembly 34 via a scavenge port 44 (FIG. 3) defined through the housing 42 along the outer perimeter of the pre-cleaner 38. For example, as will be described below, an aspiration scoop(s) 46 may be in flow communication with the scavenge port 44 via an aspiration conduit 48 to allow large particulates to be removed from the pre-cleaner 38.

Additionally, the air filter 40 may generally be configured to receive the cleaned air flowing from the pre-cleaner 38 and filter such air to provide a final stage of filtering prior to delivery of the air to the engine 20. Thus, the air filter 40 may generally include one or more filter elements (not shown) configured to catch or trap the remaining particulates contained within the cleaned air. For instance, in several embodiments, the filter element(s) may be made from a fibrous, porous or mesh material that allows air to pass therethrough while catching/trapping any particulates. The cleaned/filtered air may then be directed through a suitable output conduit 50 to the engine 20, where the air may be mixed with fuel and combusted. For instance, as shown in FIGS. 2 and 3, the output conduit 50 may extend from an output end 52 of the filter assembly 34 to an intake end 54 of a turbocharger 56 of the engine 20.

As shown in the illustrated embodiment, the air intake system 30 may also include a fan 58 and a fan shroud 60 configured to encase or otherwise surround the fan 58. In general, the fan 58 may include a plurality of fan blades 62 configured to be rotated so as to draw air through the front grille 28 (FIG. 1) of the work vehicle 10, thereby providing an airflow across one or more heat exchangers 64 (shown in phantom lines) positioned between the fan 58 and the front grille 28. For example, as shown in FIG. 2, heat exchangers 64 may be mounted to and/or otherwise supported by the fan shroud 60 at a location upstream of the fan 58 via suitable mounting flanges 66 and/or support pads 68 positioned at the front of the shroud 60. Thus, as air is drawn through the front grille 28 and is directed towards the fan 58, at least a portion of the air may pass through the upstream heat exchanger(s) 64.

It should be appreciated that the fan 58 may be configured to be rotatably driven using any suitable drive means known in the art. For instance, in one embodiment, the fan 58 may be coupled to an output shaft (not shown) of the engine 20. In another embodiment, the fan 58 may be rotatably driven by any other suitable drive means, such as by using a separate drive motor rotatably coupled to the fan 58.

It should also be appreciated that the fan shroud 60 may generally be configured to define a passageway for the air drawn through the heat exchanger(s) 64 by the fan 58. For example, as shown in the illustrated embodiment, the fan shroud 60 may define a shroud inlet 70 disposed adjacent to the heat exchanger(s) 64 and a shroud outlet 72 disposed aft of the fan 58. As such, the air passing through the heat exchanger(s) 64 may be received by the shroud inlet 70 and expelled from the fan shroud 60 via the shroud outlet 72. Additionally, as particularly shown in FIG. 2, the fan shroud 60 may, in one embodiment, be configured to transition from a generally rectangular shape at the shroud inlet 70 to a generally circular shape at the shroud outlet 72. As such, the rectangular opening defined by the shroud inlet 70 may be configured to capture the air flowing through the generally rectangular-shaped heat exchanger(s) 64 while the circular portion of the fan shroud 60 extending towards the shroud outlet 72 may be configured to encase or surround the fan blades 62. However, it should be appreciated that, in alternative embodiments, the fan shroud 60 may have any other suitable configuration/shape that permits it to function as described herein.

Additionally, in several embodiments, the aspiration scoop 46 of the air intake system 30 may be configured to extend through a portion of the fan shroud 60 such that an outlet opening (not shown) of the scoop 46 is positioned within the fan shroud 60 directly upstream of the fan 58. As such, when the fan 58 is rotated, a vacuum may be applied through the aspiration scoop 46 to allow large particulates to be sucked from the pre-cleaner 36 via the scavenge port 44. The particulates may then flow through the aspiration conduit 48 to the aspiration scoop 46 and may subsequently be expelled into the fan shroud 60 via the scoop's outlet opening.

Moreover, as shown in FIGS. 2 and 3, in several embodiments, a portion of the intake duct 36 may be configured to extend directly above the fan shroud 60. For example, the intake duct 36 may generally extend between a first end 74 in flow communication with the pre-cleaner 38 and an open second end 76 positioned directly upstream of the shroud inlet 70. As particularly shown in FIG. 2, the second end 76 of the intake duct 36 may generally define an elongated opening to allow air to be captured by the intake duct 36 as it flows through the front grille 28.

Referring still to FIGS. 2 and 3, the exhaust treatment system 32 of the work vehicle 10 may generally include a diesel oxidation catalyst (DOC) system 78 and a selective catalytic reduction (SCR) system 84 (FIG. 1). As is generally understood, the DOC system 78 may include a DOC housing 80 configured to house one or more catalysts (not shown) that serve to oxidize carbon monoxide and unburnt hydrocarbons contained within engine exhaust received from the vehicle's engine 20. For instance, as shown in FIGS. 2 and 3, a suitable exhaust conduit 82 may be coupled between the engine 20 and the DOC housing 80 to allow engine exhaust to be directed into the DOC system 78. In addition, a mixing chamber (not shown) may be defined within the DOC housing 80 to allow the exhaust flow to be mixed with at least one reductant, such as a diesel exhaust fluid (DEF) reductant or any other suitable urea-based reductant, supplied into the housing 80.

The SCR system 84 may generally be in flow communication with the DOC system 78 to allow the exhaust/reductant mixture expelled from the DOC system 78 to be supplied to the SCR system 84. For example, as shown in FIGS. 2 and 3, a conduit 86 (only a portion of which is shown) may be configured to extend between the DOC system 78 and the SCR system 84 for supplying the exhaust/reductant mixture to the SCR system 84. As is generally understood, the SCR system 84 may be configured to reduce the amount of nitrous oxide (NOx) emissions contained within the flow of engine exhaust using a suitable catalyst (not shown) that reacts with the reductant to convert the NOx emissions into nitrogen, water and carbon dioxide ($CO_2$). The cleaned exhaust flow may then be discharged from the SCR system 84 and expelled into the surrounding environment (e.g., via an exhaust pipe 88 (FIG. 1) of the work vehicle 10).

Additionally, as shown in FIGS. 2 and 3, the work vehicle 10 may also include one or more components for monitoring the emissions contained within the engine exhaust. For example, in several embodiments, the work vehicle 10 may include one or more emission sensors 100 and an emission sensor control unit 102 communicatively coupled to the sensor(s) 100. In general, the emission sensor(s) 100 may be configured to provide emission-related measurements associated with the concentration of at least one gas contained within the exhaust flow expelled from the engine 20. Thus, the emission sensor(s) 100 may generally be configured to be placed in flow communication with the exhaust flow at any suitable location downstream of the engine 20. For example, as shown in FIGS. 2 and 3, in one embodiment, the emission sensor(s) 100 may be configured to be mounted on, within and/or through a portion of the exhaust conduit 82 extending between the engine 20 and the DOC system 78 to allow the sensor(s) 100 to measure the concentration of emission gases contained within the engine exhaust. However, in other embodiments, the emission sensor(s) 100 may be placed in flow communication with the exhaust flow at any other suitable location downstream of the engine 20, such as by mounting the sensor(s) 100 on, within and/or through a portion of the DOC system 78, the conduit 86, the SCR system 84 and/or the exhaust pipe 88.

It should be appreciated that the emission sensor(s) 100 may generally be configured to measure the gas concentration of any suitable gas contained within the engine exhaust. However, in several embodiments, the emission sensor(s) 100 may correspond to one or more NOx sensors configured to measure the amount of nitrous oxide emissions contained within the exhaust flow.

As indicated above, the emission sensor(s) 100 may be configured to be communicatively coupled to an emission sensor control unit 102. In general, the control unit 102 may correspond to any suitable processor-based device, such as any suitable electronic control unit (ECU) known in the art. Thus, it should be appreciated that the control unit 102 may generally be configured to include any suitable computer and/or controller-related components.

For example, FIG. 4 illustrates a schematic view of suitable components that may be included within the control unit 102 in accordance with aspects of the present subject matter. As shown, the control unit 102 may include one or more processors 104 (e.g., one or more microprocessors) and associated memory devices 106 configured to perform a variety of computer-implemented functions. The memory device(s) 106 may generally comprise memory element(s) including, but not limited to, computer readable medium (e.g., random access memory (RAM) and/or any other suitable memory elements. As is generally understood, the memory device(s) 106 may be configured to store suitable computer-readable instructions that, when implemented by the processor(s) 104, configure the control unit 102 to perform various computer-implemented functions, such as receiving emission measurements from the emission sensor(s) 100 and/or transmitting suitable control signals to an engine controller (not shown) of the work vehicle 10.

As shown in FIG. 4, the control unit 102 may also include one or more input ports 108 for receiving measurement signals from the emission sensor(s) 100 and one or more output ports 110 for transmitting signals to other components of the work vehicle 10, such as the engine controller. For example, as shown in FIGS. 2 and 3, a suitable communicative cable 112 may be coupled between the emission sensor(s) 100 and the control unit 102 (via the input port 108) to allow measurement signals to be transmitted between such components. Moreover, as will be described below, the control unit 102 may also include a housing 114 configured to at least partially encase or otherwise surround one or more of the other components of the control unit 102, such as the processor(s) 104 and memory device(s) 106.

Referring back to FIGS. 2 and 3, in several embodiments, the control unit 102 may be configured to be mounted to the exterior surface of one of the air intake components of the work vehicle 10. For example, as shown in the illustrated embodiment, the control unit 102 is mounted to an exterior surface of the intake conduit 36. However, as will be described below with reference to FIG. 7, the control unit 102 may instead be mounted to any other suitable air intake component positioned upstream of the engine 20 relative to the flow of air through the air intake system 30, such as the filter assembly 34, the output conduit 50, the aspiration conduit 48*t* or the aspiration scoop 46.

It should be appreciated that, when the control unit 102 is mounted to one of the air intake components, the communicative cable 112 extending between the emission sensor(s) 100 and the control unit 102 may be configured to extend along and/or be mounted to such air intake component and/or any other suitable components of the work vehicle 10 to prevent damage to the cable 112. For instance, as shown in FIGS. 2 and 3, the cable 112 may be configured to run along the exterior of the filter assembly 34 and the intake conduit 36 as it extends between the emission sensor 100 and the control unit 102. In such an embodiment, the cable 112 may be secured to the exterior of the filter assembly 34 and the intake conduit 36 using any suitable attachment means known in the art, such as ties, tape, clips and/or any other suitable fasteners.

Referring now to FIGS. 5 and 6, differing views of the intake conduit 36 and control unit 102 shown in FIGS. 2 and 3 are illustrated in accordance with aspects of the present subject matter. Specifically, FIG. 5 illustrates a close-up, perspective view of a portion of the intake conduit 36 shown in FIGS. 2 and 3, particularly illustrating the control unit 102 exploded away from the intake conduit 36. Additionally, FIG. 6 illustrates a partial, cross-sectional view of the intake conduit 36 and the control unit 102 taken about line 6-6 shown in FIG. 3.

As indicated above, the control unit 102 may include a housing 114 configured to at least partially encase or otherwise surround one or more of the other components of the control unit 102. Thus, the housing 114 may generally include one or more walls defining a fully or partially enclosed volume for containing such other control unit components. For example, as shown in FIGS. 5 and 6, the walls of the housing 114 may define various exterior surfaces, such as an upper surface 116, a lower surface 118 and a plurality of side surfaces 120 extending between the upper and lower surfaces 116, 118.

Additionally, as shown in FIGS. 5 and 6, the intake conduit 36 may include a wall 122, defining an exterior surface 124 and an interior surface 126. In general, the exterior surface 124 may be defined along the outer perimeter of the intake conduit 36 and the interior surface 126 may be defined around the inner perimeter of the intake conduit 36 such that the interior surface 126 is exposed to the flow of intake air directed through the conduit 36. Moreover, as shown in FIGS. 5 and 6, the intake conduit 36 may include a cooling port 128 defined through wall 122 between the exterior and interior surfaces 124, 126. As such, a portion of the airflow flowing through the intake conduit 36 may be directed into the cooling port 128 (as indicated by arrows 130 in FIG. 6)

In several embodiments, the control unit 102 may be configured to be mounted to the intake duct 36 such that the housing 114 at least partially covers or is otherwise at least partially disposed over the cooling port 128. For example, as shown in the illustrated embodiment, the size of the cooling port 128 may be selected such that, when the control unit 102 is mounted to the intake duct 36 directly over the cooling port 128, the housing 114 completely covers the cooling port 128. Regardless, as shown in FIG. 6, by positioning the control unit 102 over the cooling port 128, the portion of the airflow directed through the cooling port 128 may flow upwards and contact the lower surface 118 of the housing 114, thereby providing a cooling effect for both the housing 114 and the control unit components contained within the housing 114. For example, by mounting the processor(s) 104 to a lower portion of the housing 114, the air contacting the housing 114 may cool its lower surface 118, which may, in turn, serve to lower the operating temperature of the processor(s) 104.

It should be appreciated that the housing 114 of the control unit 102 may be configured to be coupled to the intake conduit 36 using any suitable attachment means known in the art. For example, as shown in FIGS. 5 and 6, the housing 114 includes a projection 132 defining a fastener opening 134. In such an embodiment, a corresponding opening 136 may be defined through the intake conduit 36 so that a suitable mechanical fastener 138 (e.g., a bolt, screw, pin and/or the like) may be inserted through the aligning openings 134, 136 to secure the control unit 102 to the conduit 36. In another embodiment, the housing 114 may be coupled to the intake conduit 36 using any other suitable attachment means, such as by adhering the housing 114 to the exterior surface 124 of the intake conduit 36 using a suitable adhesive.

It should also be appreciated that, in several embodiments, a suitable sealant and/or sealing mechanism (not shown) may be provided between the housing 114 and the intake conduit 46 to prevent air from being expelled from the cooling port 128 along the exterior surface 124 of the conduit 36. For example, in one embodiment, a sealant may be provided between the lower surface 118 of the housing 114 and the exterior surface, 124 of the intake conduit 36 to prevent air from being expelled from the conduit 36 between such surfaces 118, 124.

As indicated above, in other embodiments, the control unit 102 may be configured to be mounted to any other suitable component of the air intake system 30. For example, FIG. 7 illustrates a perspective view showing various different mounting locations for the control unit 102. As shown, in one embodiment, the control unit 102 may be mounted to an exterior surface of the filter assembly 34. In such an embodiment, the wall 122 shown in FIG. 6 may correspond to a wall of the housing 42 of the filter assembly 34 such that air flowing though the filter assembly 34 may be directed through a corresponding cooling port 128 defined through the housing 42 in order to cool the control unit 102.

In another embodiment, as shown in FIG. 7, the control unit 102 may be mounted to an exterior surface of the output conduit 50 of the air intake system 30, in such an embodiment, the wall 122 shown in FIG. 6 may correspond to a wall of the output conduit 50 such that air flowing though the conduit 50 may be directed through a corresponding cooling port 128 defined through the conduit 50 to provide cooling for the control unit 102. Similarly, as shown in FIG. 7, in a further embodiment, the control unit 102 may be mounted to an exterior surface of one of the aspiration components of the air intake system 30, such as the aspiration conduit 48 or the aspiration scoop 46. In such an embodiment, the wall 122 shown in FIG. 6 may correspond to a wall of the aspiration conduit 48 or the aspiration scoop 46 such that air flowing though the conduit/scoop 48, 46 may be directed through a corresponding cooling port 128 defined through the conduit/scoop 48, 46 to provide cooling for the control unit 102.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:
1. An under-hood mounting configuration for a work vehicle having an engine, the under-hood mounting configuration comprising:
an air intake system positioned upstream of the engine relative to an airflow directed through the air intake system to the engine, the air intake system comprising:
an intake conduit extending between an upstream end and a downstream end, the upstream end configured to initially receive the airflow directed through the air intake system;
a filter assembly coupled to the downstream end of the intake conduit, the filter assembly being configured to filter the airflow received from the intake conduit;
an output conduit providing a flow path between the filter assembly and the engine for supplying the filtered airflow to the engine; and
at least one aspiration component in flow communication with a portion of the filter assembly, the at least one aspiration component being configured to receive particulates expelled from the filter assembly;
wherein one of the intake conduit, the filter assembly or the at least one aspiration component includes a wall having an exterior surface and an interior surface, the wall defining a cooling port extending between the exterior surface and the interior surface; and
a control unit including a housing defining an upper surface and a lower surface opposite the upper surface, the housing being mounted to the wall along the exterior surface such that the housing is positioned directly over at least a portion of the cooling port, wherein, when the airflow is directed through the air intake system, a portion of the airflow flows through the cooling port and is directed towards the lower surface of the housing.

2. The under-hood mounting configuration of claim 1, wherein the wall forms part of the intake conduit of the air intake system.

3. The under-hood mounting configuration of claim 1, wherein the wall forms part of the filter assembly of the air intake system.

4. The under-hood mounting configuration of claim 1, wherein the wall forms part of the at least one aspiration component of the air intake system.

5. The under-hood mounting configuration of claim 4, wherein the at least one aspiration component comprises an aspiration conduit coupled to a scavenge port of the filter assembly and an aspiration scoop coupled to the aspiration conduit.

6. The under-hood mounting configuration of claim 5, further comprising a fan and a fan shroud at least partially surrounding the fan, the aspiration scoop extending through a portion of the fan shroud.

7. The under-hood mounting configuration of claim 1, wherein the housing is mounted to the wall such that the housing covers the entire cooling port.

8. The under-hood mounting configuration of claim 1, wherein the airflow flowing through the cooling port contacts the lower surface of the housing in order to provide convective cooling for the control unit.

9. A system for monitoring exhaust emissions of a work vehicle having an engine and an air intake system for supplying air to the engine, the system comprising:
   an emission sensor in flow communication with an exhaust flow expelled from the engine, the emission sensor being configured to provide emission-related measurements associated with at least one gas contained within the exhaust flow;
   a sensor control unit configured to receive the emission-related measurements from the exhaust sensor, the sensor control unit including a housing defining an upper surface and a lower surface opposite the upper surface; and
   an air intake system positioned upstream of the engine relative to an airflow directed through the air intake system to the engine, the air intake system comprising:
      an intake conduit extending between an upstream end and a downstream end, the upstream end configured to initially receive the airflow directed through the air intake system;
      a filter assembly coupled to the downstream end of the intake conduit, the filter assembly being configured to filter the airflow received from the intake conduit;
      an output conduit providing a flow path between the filter assembly and the engine for supplying the filtered airflow to the engine; and
      at least one aspiration component in flow communication with a portion of the filter assembly, the at least one aspiration component being configured to receive particulates expelled from the filter assembly;
   wherein one of the intake conduit, the filter assembly or the at least one aspiration component includes a wall having an exterior surface and an interior surface, the wall defining a cooling port extending between the exterior surface and the interior surface; and
   wherein the housing of the sensor control unit is mounted to the wall along the exterior surface such that the housing is positioned directly over at least a portion of the cooling port and wherein, when the airflow is directed through the air intake system, a portion of the airflow flows through the cooling port and is directed towards the lower surface of the housing.

10. The system of claim 9, wherein the wall forms part of the intake conduit of the air intake system.

11. The system of claim 9, wherein the wall forms part of the filter assembly of the air intake system.

12. The system of claim 9, wherein the wall forms part of the at least one aspiration component of the air intake system.

13. The system of claim 9, wherein the housing is mounted to the wall such that the housing covers the entire cooling port.

14. The system of claim 9, wherein the emission sensor comprises a NOx sensor.

15. The system of claim 9, wherein the emission sensor is in flow communication with the exhaust flow directed through an exhaust conduit extending between the engine and a DOC system of the work vehicle.

16. The system of claim 9, wherein the airflow flowing through the cooling port contacts the lower surface of the housing in order to provide convective cooling for the control unit.

17. The system of claim 12, wherein the at least one aspiration component comprises an aspiration conduit coupled to a scavenge port of the filter assembly and an aspiration scoop coupled to the aspiration conduit.

18. The system of claim 17, further comprising a fan and a fan shroud at least partially surrounding the fan, the aspiration scoop extending through a portion of the fan shroud.

* * * * *